United States Patent
Yang et al.

(10) Patent No.: US 8,515,000 B2
(45) Date of Patent: Aug. 20, 2013

(54) SHIFT REGISTER CIRCUIT

(75) Inventors: Yu-Chung Yang, Hsin-Chu (TW);
Yung-Chih Chen, Hsin-Chu (TW);
Chih-Ying Lin, Hsin-Chu (TW);
Kun-Yueh Lin, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 91 days.

(21) Appl. No.: 13/044,773

(22) Filed: Mar. 10, 2011

(65) Prior Publication Data

US 2012/0051494 A1 Mar. 1, 2012

(30) Foreign Application Priority Data

Sep. 1, 2010 (TW) ................................ 99129561 A

(51) Int. Cl.
*G11C 19/00* (2006.01)
(52) U.S. Cl.
USPC .................... 377/64; 377/68; 377/78; 377/79
(58) Field of Classification Search
None
See application file for complete search history.

(56) References Cited

U.S. PATENT DOCUMENTS

| | | | | |
|---|---|---|---|---|
| 7,023,410 B2* | 4/2006 | Lee et al. | | 345/87 |
| 7,369,111 B2* | 5/2008 | Jeon et al. | | 345/100 |
| 7,627,077 B2* | 12/2009 | Wei et al. | | 377/64 |
| 7,738,623 B2* | 6/2010 | Tobita | | 377/64 |
| 7,907,696 B2* | 3/2011 | Chen et al. | | 377/64 |
| 7,953,201 B2* | 5/2011 | Tsai et al. | | 377/64 |
| 8,068,577 B2* | 11/2011 | Liao et al. | | 377/64 |
| 8,081,731 B2* | 12/2011 | Lin et al. | | 377/64 |
| 2006/0164376 A1 | 7/2006 | Moon | | |
| 2009/0304138 A1* | 12/2009 | Tsai et al. | | 377/79 |
| 2009/0304139 A1* | 12/2009 | Tsai et al. | | 377/79 |
| 2011/0044423 A1 | 2/2011 | Lin et al. | | |
| 2011/0069806 A1* | 3/2011 | Liao et al. | | 377/64 |
| 2011/0234577 A1* | 9/2011 | Yang et al. | | 345/212 |
| 2012/0076256 A1* | 3/2012 | Yonemaru et al. | | 377/79 |

* cited by examiner

*Primary Examiner* — Tuan T Lam
(74) *Attorney, Agent, or Firm* — WPAT, PC; Justin King

(57) ABSTRACT

A shift register circuit includes a plurality of shift registers. Each of the shift registers is configured for outputting a corresponding start-pulse signal and a corresponding driving-pulse signal. Each of the shift registers includes a pull-up circuit, a first driving circuit, a second driving circuit and a discharging circuit. The pull-up circuit is configured for charging a first node. The first driving circuit is configured for generating the corresponding start-pulse signal, and the second driving circuit is configured for generating the corresponding driving-pulse signal. The discharging circuit firstly discharges the first node before discharging an output terminal of the second driving circuit.

19 Claims, 6 Drawing Sheets

SHIFT REGISTER CIRCUIT

FIELD OF THE INVENTION

The present invention relates to the display field, and more particularly to a shift register circuit.

BACKGROUND OF THE INVENTION

A conventional shift register circuit applied into a flat panel display device such as liquid crystal display (LCD) device generally comprises a plurality of shift registers connected in cascade, to generate a plurality of drive-pulse signals in order, such as a plurality of gate drive-pulse signals configured for sequentially driving gate lines of the LCD device. Furthermore, each of the shift registers is also configured for generating a corresponding start-pulse signal, which will be transmitted to a succeeding shift register such that the succeeding shift register starts to operate.

The conventional shift register circuit is manufactured on a glass substrate by an α-Si process or a p-Si process, to reduce the cost of gate driving chip, simplify module-manufacturing processes and improve an utilization ratio of the glass substrate, etc. However, since the mobility of carriers of the material thereof is relatively low, it needs design out thin-film transistors with large size to effectively drive the gate lines of the LCD device. The thin-film transistors with the large size will generate large parasitic capacitance effect, such that dynamic power consumption thereof is increased and application ranges thereof are restricted.

SUMMARY OF THE INVENTION

Therefore, an objective of the present invention is to provide a shift register circuit, which can greatly decrease dynamic power consumption.

An embodiment of the present invention provides a shift register circuit, which comprises a plurality of shift registers. Each of the shift registers is configured for outputting a corresponding start-pulse signal and a corresponding driving-pulse signal. Furthermore, each of the shift registers comprises a pull-up circuit, a first driving circuit, a second driving circuit and a discharging circuit. The pull-up circuit receives the corresponding start-pulse signal outputted from a nearest preceding shift register and a reference signal to charge a first node. The first driving circuit is electrically coupled to the pull-up circuit at the first node, and receives a corresponding clock signal to generate the corresponding start-pulse signal according to a voltage on the first node. The second driving circuit is electrically coupled to the pull-up circuit at the first node, and receives a high reference voltage to output the corresponding driving-pulse signal at an output terminal of the second driving circuit. The discharging circuit comprises a first transistor and a second transistor. The first transistor comprises a first control terminal, a first terminal and a second terminal. The first terminal is electrically coupled to the first node, the second terminal is electrically coupled to a low reference voltage, and the first control terminal receives a first control signal to discharge the first node during a first time period. The second transistor comprises a second control terminal, a third terminal and a fourth terminal. The third terminal is electrically coupled to the output terminal of the second driving circuit, the fourth terminal is electrically coupled to the low reference voltage, and the second control terminal receives a second control signal to discharge the output terminal of the second driving circuit during a second time period. A start point of the first time period is earlier than that of the second time period.

In an exemplary embodiment of the present invention, the first control signal received by the first control terminal of the first transistor is the corresponding start-pulse signal outputted from a nearest succeeding shift register, to discharge the voltage on the first node during the first time period. The second control signal received by the second control terminal of the second transistor is the corresponding start-pulse signal outputted from a second nearest succeeding shift register, to discharge the output terminal of the second driving circuit during the second time period.

In an exemplary embodiment of the present invention, the discharging circuit further comprises a third transistor, which comprises a third control terminal, a fifth terminal and a sixth terminal. The fifth terminal is electrically coupled to the second control terminal of the second transistor, and the sixth terminal is electrically coupled to the low reference voltage. The third control terminal receives the voltage on the first node to regulate the corresponding start-pulse signal received by the second control terminal of the second transistor.

In an exemplary embodiment of the present invention, the first control signal received by the first control terminal of the first transistor is the corresponding driving-pulse signal outputted from a second nearest succeeding shift register, to discharge the first node during the first time period. The second control signal received by the second control terminal of the second transistor is the corresponding driving-pulse signal outputted from a third nearest succeeding shift register, to discharge the output terminal of the second driving circuit during the second time period.

In an exemplary embodiment of the present invention, the first control signal received by the first control terminal of the first transistor is the corresponding driving-pulse signal outputted from a second nearest succeeding shift register, to discharge the first node during the first time period. The second control signal received by the second control terminal of the second transistor is the corresponding start-pulse signal outputted from the second nearest succeeding shift register, to discharge the output terminal of the second driving circuit.

In an exemplary embodiment of the present invention, the pull-up circuit comprises a fourth transistor, and the fourth transistor comprises a fourth control terminal, a seventh terminal and an eighth terminal. The fourth control terminal receives the corresponding start-pulse signal outputted from the nearest preceding shift register. The seventh terminal receives the reference signal. The eighth terminal is electrically coupled to the first node.

In an exemplary embodiment of the present invention, the reference signal is the high reference voltage. Alternatively, the reference signal is the corresponding driving-pulse signal outputted from the nearest preceding shift register. In another embodiment, the reference signal is the corresponding start-pulse signal outputted from the nearest preceding shift register.

In an exemplary embodiment of the present invention, the first driving circuit comprises a fifth transistor and a capacitor. The fifth transistor comprises a fifth control terminal, a ninth terminal and a tenth terminal. The fifth control terminal is electrically coupled to the first node. The ninth terminal receives the corresponding clock signal, and the tenth terminal outputs the corresponding start-pulse signal. The capacitor is electrically coupled between the first node and the tenth terminal.

In an exemplary embodiment of the present invention, the second driving circuit comprises a sixth transistor, which comprises a sixth control terminal, an eleventh terminal and a twelfth terminal. The sixth control terminal is electrically coupled to the first node, the eleventh terminal receives the high reference voltage, and the twelfth terminal outputs the corresponding driving-pulse signal.

In an exemplary embodiment of the present invention, each of the shift registers further comprises a first voltage-stabilizing circuit and a first voltage-stabilizing control circuit. The first voltage-stabilizing circuit is electrically coupled to the first node and the output terminal of the second driving circuit. The first voltage-stabilizing control circuit is electrically coupled to the first voltage-stabilizing circuit and receives at least one control signal to determine whether the first voltage-stabilizing circuit to discharge the first node and the output terminal of the second driving circuit.

In an exemplary embodiment of the present invention, the first voltage-stabilizing circuit comprises a seventh transistor and an eighth transistor. The seventh transistor comprises a seventh control terminal, a thirteenth terminal and a fourteenth terminal. The seventh control terminal is electrically coupled to an output terminal of the first voltage-stabilizing control circuit. The thirteenth terminal receives the corresponding driving-pulse signal, and the fourteenth terminal is electrically coupled to the first node. The eighth transistor comprises an eighth control terminal, a fifteenth terminal and a sixteenth terminal. The eighth control terminal is electrically coupled to the output terminal of the first voltage-stabilizing control circuit, the fifteenth terminal is electrically coupled to the low reference voltage, and the sixteenth terminal is electrically coupled to the output terminal of the second driving circuit.

In an exemplary embodiment of the present invention, the first voltage-stabilizing control circuit comprises a ninth transistor, a tenth transistor, an eleventh transistor and a twelfth transistor. The ninth transistor comprises a ninth control terminal, a seventeenth terminal and an eighteenth terminal. The ninth control terminal is electrically coupled to a reference voltage, and the seventeenth terminal is also electrically coupled to the reference voltage. The tenth transistor comprises a tenth control terminal, a nineteenth terminal and a twentieth terminal. The tenth control terminal receives a third control signal. The nineteenth terminal is electrically coupled to the eighteenth terminal and whereby an electrical connection node therebetween is used as a second node. The twentieth terminal is electrically coupled to the low reference voltage. The eleventh transistor comprises an eleventh control terminal, a twenty-first terminal and a twenty-second terminal. The eleventh control terminal is electrically coupled to the second node, and the twenty-first terminal is electrically coupled to the reference voltage. The twelfth transistor comprises a twelfth control terminal, a twenty-third terminal and a twenty-fourth terminal. The twelfth control terminal also receives the third control signal, and the twenty-third terminal is electrically coupled to the low reference voltage. The twenty-fourth terminal is electrically coupled to the twenty-second terminal and whereby an electrical connection node therebetween is used as the output terminal of the first voltage-stabilizing control circuit.

In an exemplary embodiment of the present invention, the third control signal is the corresponding driving-pulse signal.

In an exemplary embodiment of the present invention, the first voltage-stabilizing control circuit further comprises a thirteenth transistor and a fourteenth transistor. The thirteenth transistor comprises a thirteenth control terminal, a twenty-fifth terminal and a twenty-sixth terminal. The thirteenth control terminal receives a fourth control signal, the twenty-fifth terminal is electrically coupled to the second node, and the twenty-sixth terminal is electrically coupled to the low reference voltage. The fourteenth transistor comprises a fourteenth control terminal, a twenty-seventh terminal and a twenty-eighth terminal. The fourteenth control terminal also receives the fourth control signal, the twenty-seventh terminal is electrically coupled to the low reference voltage, and the twenty-eighth terminal is electrically coupled to the output terminal of the first voltage-stabilizing control circuit.

In an exemplary embodiment of the present invention, the fourth control signal is the corresponding driving-pulse signal outputted from the nearest preceding shift register. Alternatively, the fourth control signal is the corresponding start-pulse signal.

In an exemplary embodiment of the present invention, the third control signal is the voltage on the first node.

Since the second driving circuit of the shift register of the present invention employs the constant high reference voltage to charge the output terminal thereof, the discharging circuit firstly discharges the first node to pull down the voltage of the first node before discharging the output terminal of the second driving circuit, therefore the present invention can prevent the constant reference voltage from still charging the output terminal of the second driving circuit, and thus can greatly decrease the dynamic power consumption of the shift register.

BRIEF DESCRIPTION OF THE DRAWINGS

The above objectives and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
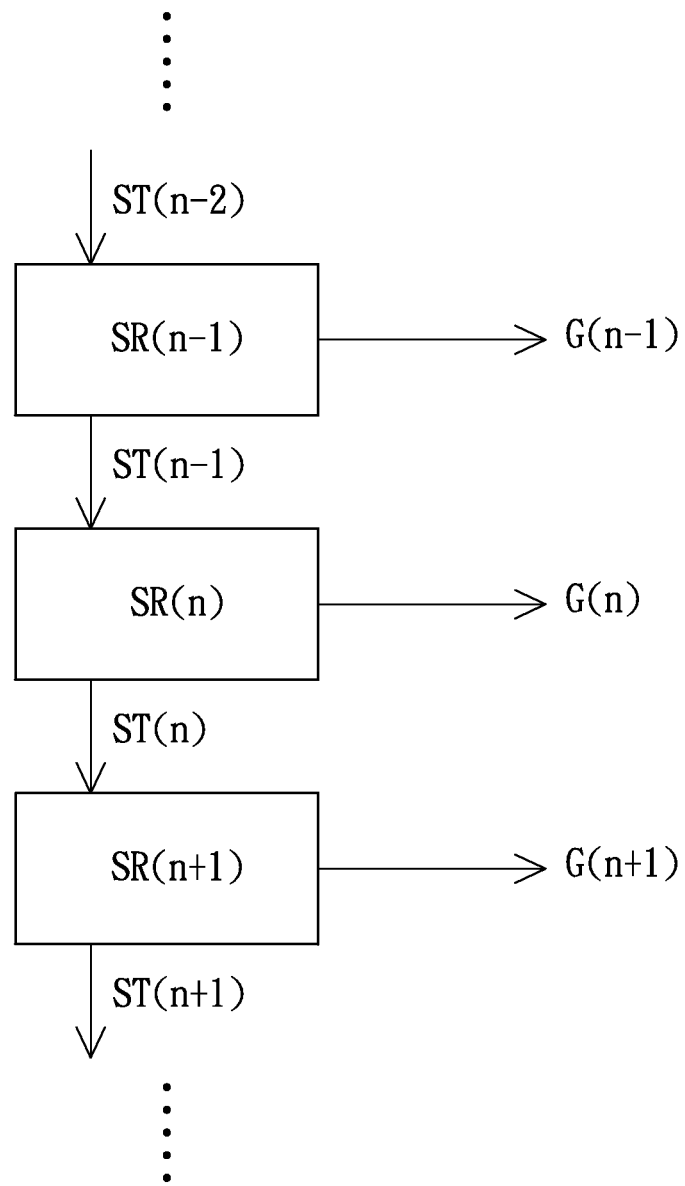
FIG. 1 is a partial-structure schematic view of a shift register circuit in accordance with an exemplary embodiment of the present invention.

Refer to FIG. 1, which is a partial-structure schematic view of a shift register circuit in accordance with an exemplary embodiment of the present invention. As shown in FIG. 1, the shift register circuit 100 of the present invention may be adapted into a gate driving circuit of a liquid crystal display device, for sequentially driving gate lines of the liquid crystal display device, but the present invention is not limited in this. For example, the shift register circuit 100 of the present invention also may be adapted into a source driving circuit of the liquid crystal display device. The shift register circuit 100 may comprise a plurality of shift registers cascade-coupled with one another, such as SR(n−1), SR(n) and SR(n+1), etc. Each of the shift registers is configured (i.e., structured and arranged) for generating a corresponding gate driving-pulse signal in an order, such as G(n−1), G(n) or G(n+1), and is also configured for generating a corresponding start-pulse signal in an order, such as ST(n−1), ST(n) or ST(n+1). The corresponding start-pulse signal of each of the shift registers is transmitted to a succeeding shift register such that the succeeding shift register starts to operate.

Figure 2:
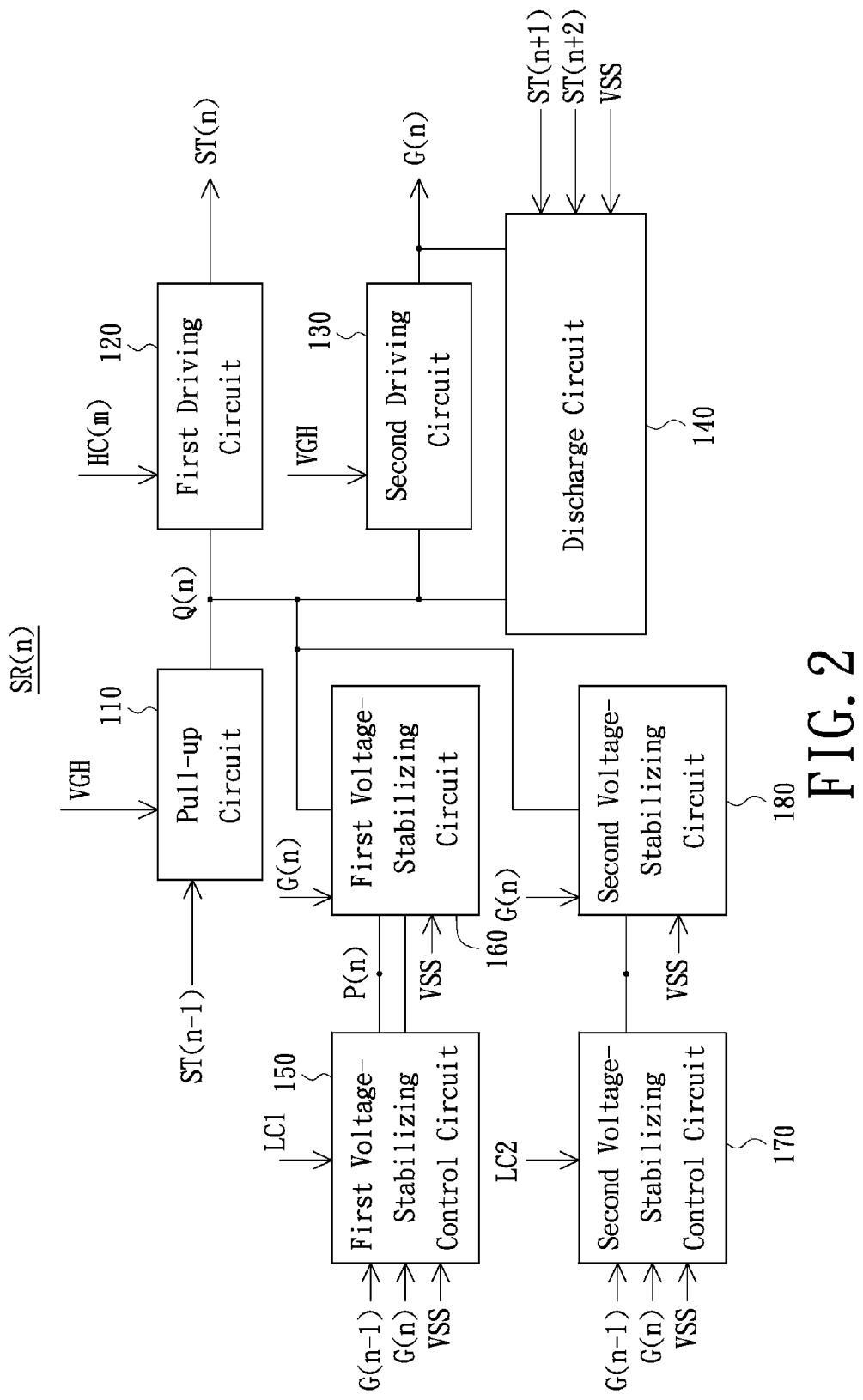
FIG. 2 is a block schematic view of a shift register in accordance with an exemplary embodiment of the present invention.
Figure 3:
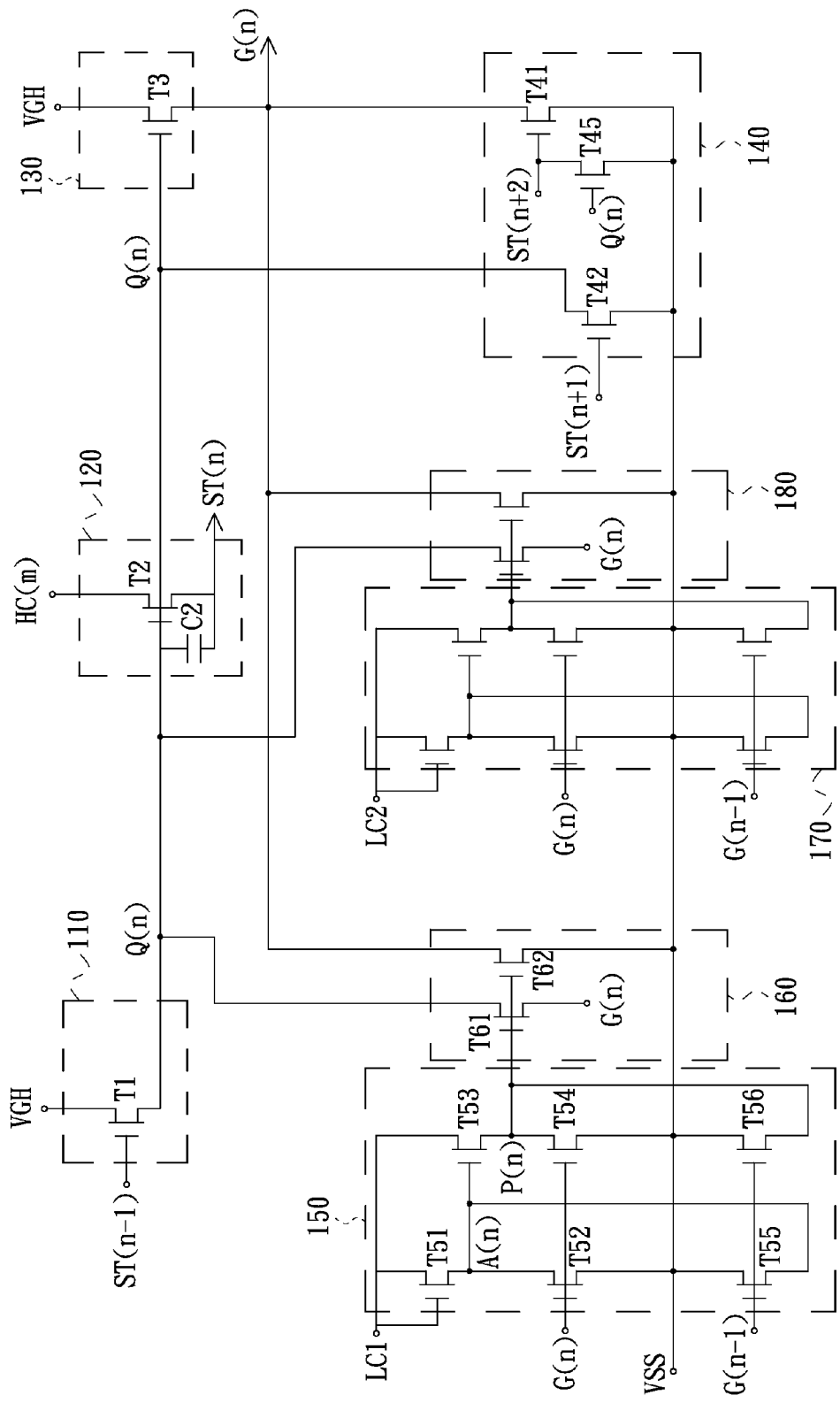
FIG. 3 is a detailed-circuit schematic view of the shift register as shown in FIG. 2.

Refer to FIGS. 2 and 3, wherein FIG. 2 is a block schematic view of a shift register in accordance with an exemplary embodiment of the present invention, and FIG. 3 is a detailed-circuit schematic view of the shift register as shown in FIG. 2. As shown in FIGS. 2 and 3, the exemplary embodiment employs the shift register SR(n) as shown in FIG. 1 as an example to describe the present invention. In detail, the shift register SR(n) may comprise a pull-up circuit 110, a first driving circuit 120, a second driving circuit 130 and a discharging circuit 140. The first driving circuit 120 and the second driving circuit 130 are connected in parallel. The pull-up circuit 110 is electrically coupled to both the first driving circuit 120 and the second driving circuit 130 and an electrical connection node between the pull-up circuit 110 and the first and second driving circuits 120, 130 is used as a first node Q(n).

The pull-up circuit 110 receives a preceding start-pulse signal ST(n−1) outputted from a nearest preceding shift register ST(n−1) and a reference signal VGH, to charge the first node Q(n). In detail, the pull-up circuit 100 may comprise a transistor T1, a gate terminal thereof receives the preceding start-pulse signal ST(n−1), a source terminal thereof receives the reference signal VGH, and a drain terminal thereof is electrically coupled to the first node Q(n).

The first driving circuit 120 is electrically coupled to the first node Q(n), and receives a corresponding clock signal HC(m) to generate the corresponding start-pulse signal ST(n) according to the voltage on the first node Q(n). In detail, the first driving circuit 120 may comprise a transistor T2 and a capacitor C2. A gate terminal of the transistor T2 is electrically coupled to the first node Q(n), a source terminal thereof receives the corresponding clock signal HC(m), and a drain terminal thereof is used as an output terminal of the first driving circuit 120 to output the corresponding start-pulse signal ST(n). The capacitor C2 is electrically coupled between the gate terminal and the drain terminal of the transistor T2.

The second driving circuit 130 is also electrically coupled to the first node Q(n), and receives a high reference voltage VGH to generate a corresponding gate driving-pulse signal G(n), for driving a corresponding gate line of the liquid crystal display device. In detail, the second driving circuit 130 may comprise a transistor T3. A gate terminal of the transistor T3 is electrically coupled to the first node Q(n), a source terminal thereof receives the high reference voltage VGH, and a drain terminal thereof is used as an output terminal of the second driving circuit 130 to output the corresponding gate driving-pulse signal G(n).

The discharging circuit 140 is electrically coupled to both the first node Q(n) and the output terminal of the second driving circuit 130, and receives a first control signal, a second control signal and a low reference potential VSS to discharge the first node Q(n) during a first time period, and further discharge the output terminal of the second driving circuit 130 during a second time period. In the exemplary embodiment, the first control signal may be a succeeding start-pulse signal ST(n+1) outputted from a nearest succeeding shift register SR(n+1) (not shown), and the second control signal may be a succeeding start pulse signal ST(n+2) outputted from a second nearest succeeding shift register SR(n+2) (not shown). In detail, the discharging circuit 140 may comprise a transistor T41 and a transistor T42. A gate terminal of the transistor T42 receives the first control signal ST(n+1), a source terminal thereof is electrically coupled to the low reference voltage VSS, and a drain terminal thereof is electrically coupled to the first node Q(n). A gate terminal of the transistor T41 receives the second control signal ST(n+2), a source terminal thereof is electrically coupled to the low reference voltage VSS, and a drain terminal thereof is electrically coupled to the output terminal of the second driving circuit 130.

Figure 4:
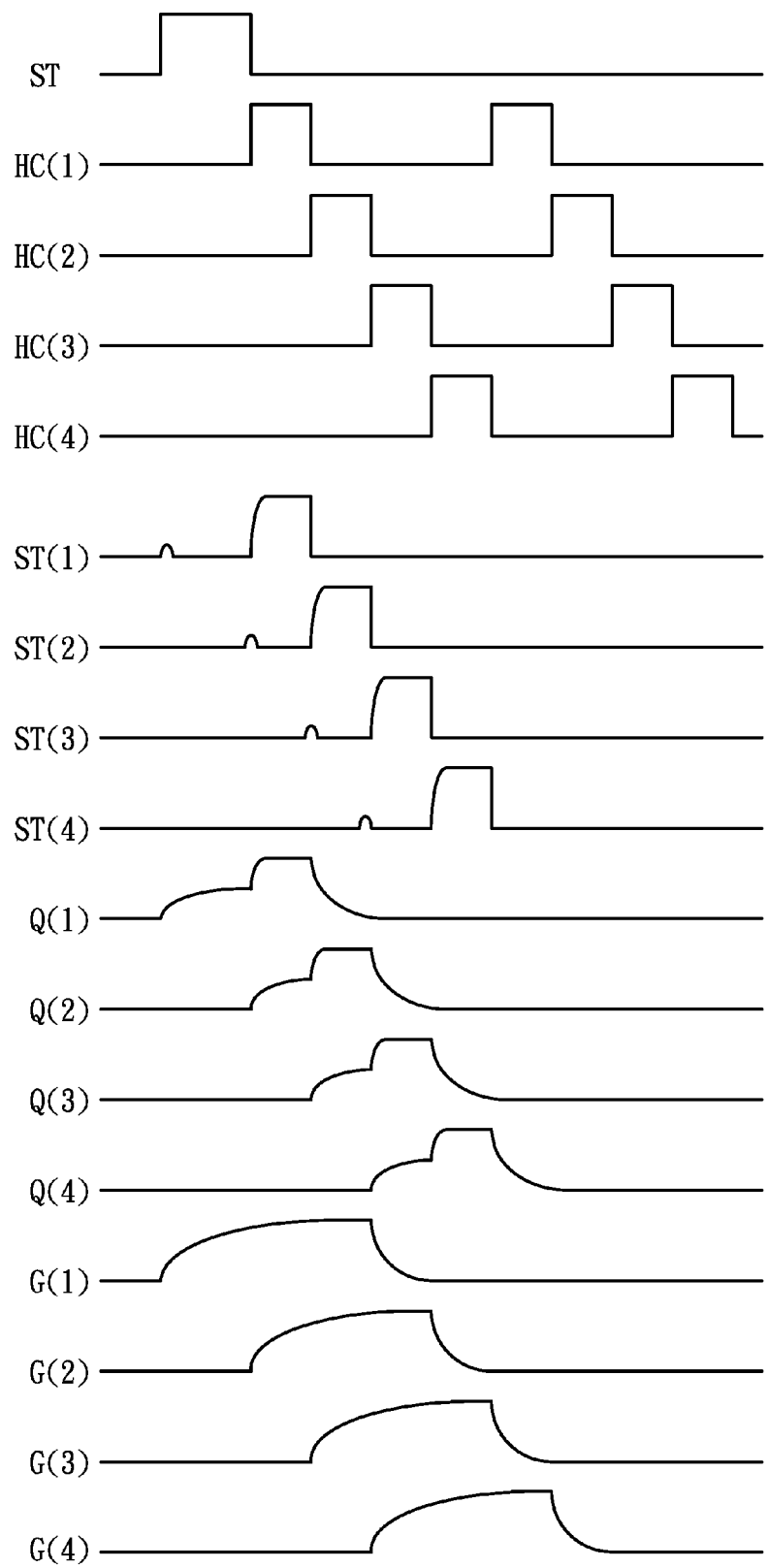
FIG. 4 is a time-sequence view of various signals as shown in FIG. 2.

Refer to FIG. 4, which is a time-sequence view of various signals. As shown in FIGS. 2 to 4, the following will describe the operation principle of the shift register of the present invention in detail. The following employs four clock signals HC(1)~HC(4) as an example to describe the present invention. It is understood for persons skilled in the art that, the amount of the clock signals may be determined by the amount of the pixels of the liquid crystal display device, and the present invention is not limited in this. After the liquid crystal display device receives a start signal ST, the clock signals HC(1)~HC(4) are turned on in order.

Here will employ the second-staged shift register SR(2) as an example to describe the exemplary embodiment. When a preceding start-pulse signal ST(1) outputted from a nearest preceding shift register SR(1) is at a high voltage, the transistor T1 of the pull-up circuit 110 turns on, and a reference signal charges the first node Q(2). In this exemplary embodiment, the reference signal may be the high reference voltage VGH. Therefore, the transistor T2 of the first driving circuit 120 is controlled by the voltage on the first node Q(2) to be turned on, but the clock signal HC(2) received by the source terminal of the transistor T2 is still at the low voltage. Thus the corresponding start-pulse signal ST(2) generated by the first driving circuit 120 is at the low voltage, but may generate a little fluctuation at this moment. In addition, the transistor T3 of the second driving circuit 130 is controlled by the voltage on the node Q(2) to be turned on. Furthermore, since the source terminal of the transistor T3 is electrically coupled to the constant high reference voltage VGH, the high reference voltage VGH charges the drain terminal thereof to pull up the gate driving-pulse signal G(n) generated on the drain terminal, such that the gate driving-pulse signal G(n) is at the high voltage.

When the start-pulse signal ST(1) outputted from the nearest preceding shift register SR(1) is at the low voltage, the transistor T1 of the pull-up circuit 110 turns off. At this moment, the first node Q(2) is in a floating state, the transistor T2 of the first driving circuit 120 still turns on, the clock signal HC(2) received by the source terminal of the transistor T2 is at the high voltage, and the corresponding start-pulse signal ST(2) generated on the drain terminal thereof is pulled up to be the high voltage until the corresponding clock signal HC(2) is end. Furthermore, since the capacitor C2 exists, the voltage on the first node Q(2) is further pulled up corresponding to the start-pulse signal ST(2). In addition, the transistor T3 of the second driving circuit 130 is controlled by the potential of the first node Q(2) to still be turned on, the high reference voltage VGH still charge the drain terminal thereof, and the gate driving-pulse signal G(n) generated on the drain terminal thereof is still at the high voltage.

Furthermore, since the gate terminal of the transistor T42 of the discharging circuit 140 is controlled by the first control signal ST(3), and thus when the first control signal i.e., the succeeding start-pulse signal ST(3) outputted from the nearest succeeding shift register SR(3) is at the high voltage, the transistor T42 turns on. At this moment, since the source terminal of the transistor T42 is electrically coupled to the low reference voltage VSS, the discharging circuit 140 will discharge the first node Q(n) through the transistor T42 during the first time period, that is pulling down the voltage on the first node Q(n). In addition, since the gate terminal of the transistor T41 of the discharging circuit 140 is controlled by the second control signal ST(4), and thus when the second control signal i.e., the succeeding start-pulse signal ST(4) outputted from the second nearest succeeding shift register SR(4) is at the high voltage, the transistor T41 turns on. Thus the output terminal of the second driving circuit 130 is discharged through the transistor T41 during the second time period, that is pulling down the corresponding gate driving-pulse signal G(2).

Furthermore, as shown in FIG. 4, a start time of the first control signal ST(3) is earlier than that of the second control signal ST(4), thus the discharge operation directed at the first node Q(n) is earlier than that directed at the output terminal of the second driving circuit 130. That is, the voltage on the first node Q(n) has been pulled down the low voltage before performing the discharge operation directed at the output terminal of the second driving circuit 130, the transistor T3 of the second driving circuit 130 turns off, and the high reference voltage VGH stops charging the output terminal of the second driving circuit 130. Therefore, the present invention will not appear a situation of the high reference voltage VGH still charging the output terminal of the second driving circuit 130 when the discharging circuit 140 discharging the output terminal of the second driving circuit 130. Therefore, the shift register of the present invention would greatly decrease the dynamic power consumption.

In addition, the discharging circuit of the exemplary embodiment of the present invention may further comprise a transistor T45. A gate terminal of the transistor T45 is electrically coupled to the first node Q(n) for receiving the voltage on the first node Q(n), a source terminal thereof is electrically coupled to the low reference voltage VSS, and a drain terminal thereof is electrically coupled to the gate terminal of the transistor T41 for regulating the second control signal ST(n+2) received by the gate terminal of the transistor T41. Therefore, for the second-staged shift register SR(2), when the voltage on the first node Q(2) is at the high voltage, the transistor T45 turns on, and the low reference voltage VSS discharges the drain terminal of the transistor T45. Therefore, the second control signal ST(4) is pulled down at this moment to eliminate the fluctuation of the second control signal ST(4) herein.

Referring to FIGS. 2 and 3 again, the shift register SR(n) further comprises a first voltage-stabilizing control circuit 150, a first voltage-stabilizing circuit 160, a second voltage-stabilizing control circuit 170 and a second voltage-stabilizing circuit 180. The first voltage-stabilizing control circuit 150 is electrically coupled to the first voltage-stabilizing circuit 160 for controlling the operation of the first voltage-stabilizing circuit 160. The first voltage-stabilizing circuit 160 is electrically coupled to the first node Q(n) and the output terminal of the second driving circuit 130 for stabilizing the voltage on the first node Q(n) and the gate driving-pulse signal G(n) outputted from the second driving circuit 130. The circuit structures of the second voltage-stabilizing control circuit 170 and the second voltage-stabilizing circuit 180 are same to those of the first voltage-stabilizing control circuit 150 and the first voltage-stabilizing circuit 160 respectively, and they are also configured for further stabilizing the voltage on the first node Q(n) and the gate driving-pulse signal G(n) outputted from the second driving circuit 130.

In detail, the first voltage-stabilizing control circuit 150 comprises a transistor T51, a transistor T52, a transistor T53, a transistor T54, a transistor T55 and a transistor T56. A gate terminal of the transistor T51 is electrically coupled to a first reference voltage LC1, a source terminal thereof is also electrically coupled to the first reference voltage LC1, and a drain terminal thereof is electrically coupled to a drain terminal of the transistor T52 and whereby an electrical connection node therebetween is defined as a second node A(n). A gate terminal of the transistor T52 receives a third control signal such as the corresponding gate driving-pulse signal G(n), and a source terminal thereof is electrically coupled to the low reference voltage VSS. A gate terminal of the transistor T53 is electrically coupled to the second node A(n), a source terminal thereof is electrically coupled to the first reference voltage LC1, and a drain terminal thereof is electrically coupled to a drain terminal of the transistor T54 and whereby an electrical connection node therebetween is define as a third node P(n). The third node P(n) is used as an output terminal of the first voltage-stabilizing control circuit 150. A gate terminal of the transistor T54 also receives the third control signal G(n), and a source terminal thereof is electrically coupled to the low reference voltage VSS. A gate terminal of the transistor T55 receives a fourth control signal such as the preceding gate driving-pulse signal G(n−1) outputted from the nearest preceding shift register SR(n−1), a source terminal thereof is electrically coupled to the low reference voltage VSS, and a drain terminal thereof is also electrically coupled to the second node A(n). A gate terminal of the transistor T56 also receives the fourth control signal G(n−1), a source terminal thereof is electrically coupled to the low reference voltage VSS, and a drain terminal thereof is also electrically coupled to the third node P(n).

That is, a circuit consisted of the transistor T55 and the transistor T56 is connected with another circuit consisted of the transistor T52 and the transistor T54 in parallel with each other. Furthermore, the transistor T52 and the transistor T54 are controlled by the third control signal G(n), while the transistor T55 and the transistor T56 are controlled by the fourth control signal G(n−1).

The first voltage-stabilizing circuit 160 may comprise a transistor T61 and a transistor T62. Gate terminals of the transistors T61, T62 are both electrically coupled to the output terminal P(n) of the first voltage-stabilizing control circuit 150. A source terminal of the transistor T61 is electrically coupled to the corresponding gate driving-pulse signal G(n), and a drain terminal thereof is electrically coupled to the first node Q(n). A source terminal of the transistor T62 is electrically coupled to the low reference voltage VSS, and a drain terminal thereof is electrically coupled to the output terminal of the second driving circuit 130.

In the exemplary embodiment, the first voltage-stabilizing control circuit 150 receives the third control signal G(n) for ensuring a control signal outputted from the output terminal P(n) of the first voltage-stabilizing control circuit 150 to make the first voltage-stabilizing circuit 160 stop discharging the first node Q(n) and the output terminal of the second driving circuit 130 when the present-staged shift register SR(n) operates. In addition, the first voltage-stabilizing control circuit 150 receives the fourth control signal G(n−1), for ensuring the control signal outputted from the output terminal P(n) of the first voltage-stabilizing control circuit 150 to make the first voltage-stabilizing circuit 160 stop discharging the first node Q(n) and the output terminal of the second driving circuit 130 when the nearest preceding shift register SR(n−1) operates, so as to further stabilize the voltage on the first node Q(n) and the corresponding gate driving-pulse signal G(n) outputted from the output terminal of the second driving circuit 130.

In addition, the circuit structures of the second voltage-stabilizing control circuit 170 and the second voltage-stabilizing circuit 180 are similar to those of the first voltage-stabilizing control circuit 150 and the first voltage-stabilizing circuit 160 respectively, except that the second voltage-stabilizing control circuit 170 is electrically coupled to a second reference voltage LC2. Thus the other circuit structures are not repeatedly described herein.

Figure 5:
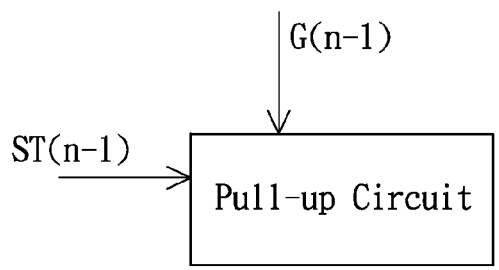
FIG. 5 is a schematic view of a pull-up circuit in accordance with another exemplary embodiment of the present invention.

Refer to FIG. 5, which is a schematic view of a pull-up circuit in accordance with another exemplary embodiment of the present invention. As shown in FIG. 5, the pull-up circuit of the present exemplary embodiment is similar with the pull-up circuit as shown in FIGS. 2 and 3, except that the reference signal received by the pull-up circuit of the present exemplary embodiment is not the constant high reference voltage VGH, but is a preceding gate driving-pulse signal G(n−1) outputted from a nearest preceding shift register SR(n−1). When the preceding start-pulse signal ST(n−1) outputted from the nearest preceding shift register SR(n−1) turns on the transistor T1 of the pull-up circuit 110 of the present shift register SR(n), the preceding gate driving-pulse signal G(n−1) can charge the first node Q(n) to pull up the voltage on the first node Q(n).

Figure 6:
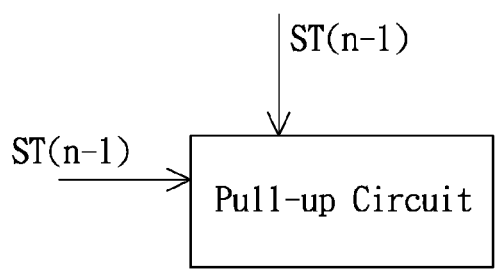
FIG. 6 is a schematic view of a pull-up circuit in accordance with other exemplary embodiment of the present invention.

Refer to FIG. 6, which is a schematic view of a pull-up circuit in accordance with other exemplary embodiment of the present invention. As shown in FIG. 6, the pull-up circuit of the present exemplary embodiment is similar with the pull-up circuit as shown in FIGS. 2 and 3, except that the reference signal received by the pull-up circuit is not the constant high reference voltage VGH, but is a preceding start-pulse signal ST(n−1) outputted from the nearest preceding shift register SR(n−1). When the preceding start-pulse signal ST(n−1) outputted from the nearest preceding shift register SR(n−1) turns on the transistor T1 of the pull-up circuit 110 of the present shift register SR(n), the preceding start-pulse signal ST(n−1) also can charge the first node Q(n) to pull up the voltage on the first node Q(n). Of course, it is understood for persons skilled in the art that, the reference signal received by the pull-up circuit also may be other signals, for example be any signal which can charge the first node Q(n) when the preceding start-pulse signal ST(n−1) outputted from the nearest preceding shift register SR(n−1) turns on the transistor T1 of the pull-up circuit 110 of the present shift register SR(n).

Figure 7:
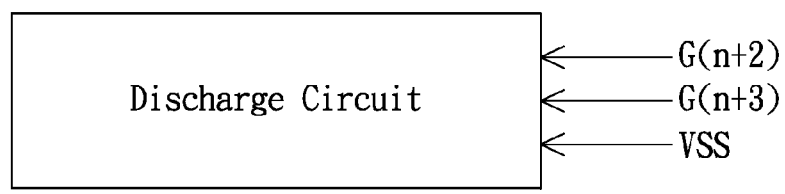
FIG. 7 is a schematic view of a discharging circuit in accordance with another exemplary embodiment of the present invention.

Refer to FIG. 7, which is a schematic view of a discharging circuit in accordance with another exemplary embodiment of the present invention. As shown in FIG. 7, the discharging circuit of the exemplary embodiment is similar with the discharging circuit as shown in FIGS. 2 and 3, except that the first control signal is a succeeding gate driving-pulse signal G(n+2) outputted from a second nearest succeeding shift register SR(n+2) to discharge the first node Q(n) during the first time period, and the second control signal is another succeeding gate driving-pulse signal G(n+3) outputted from a third nearest succeeding shift register SR(n+3) to discharge the output terminal of the second driving circuit 130 during the second time period. Since the start time of the succeeding gate driving-pulse signal G(n+2) is earlier than that of the succeeding gate driving-pulse signal G(n+3), it can ensure the discharging circuit 140 firstly discharges the first node Q(n) so as to prevent the high reference voltage VGH from still charging the output terminal of the second driving circuit 130 when discharging the output terminal of the second driving circuit 130.

Figure 8:
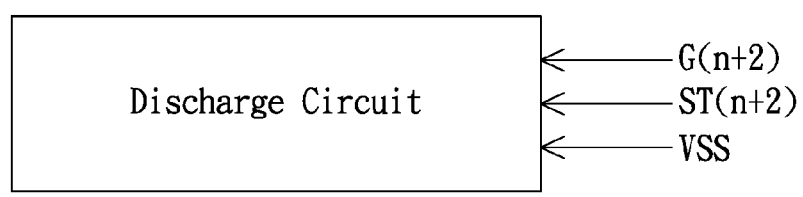
FIG. 8 is a schematic view of a discharging circuit in accordance with other exemplary embodiment of the present invention.

Refer to FIG. 8, which is a schematic view of a discharging circuit in accordance with other exemplary embodiment of the present invention. As shown in FIG. 8, the discharging circuit of the present exemplary embodiment is similar with the discharging circuit as shown in FIGS. 2 and 3, except that the first control signal is a succeeding gate driving-pulse signal G(n+2) outputted from a second nearest succeeding shift register SR(n+2) to discharge the first node Q(n) during the first time period, and the second control signal is a succeeding start-pulse signal ST(n+2) outputted from the second nearest succeeding shift register SR(n+2) to discharge the output terminal of the second driving circuit 130 during the second time period. Since the start time of the succeeding gate driving-pulse signal G(n+2) is earlier than that of the succeeding start-pulse signal ST(n+2), it also can ensure the discharging circuit 140 firstly discharges the first node Q(n). Of course, it is understood for persons skilled in the art that, the first control signal and the second control signal also may be combinations of other signals, which can control the discharging circuit 140 firstly discharge the first node Q(n) to pull down the voltage on the first node Q(n) before discharging the output terminal of the second driving circuit 130.

Figure 9:
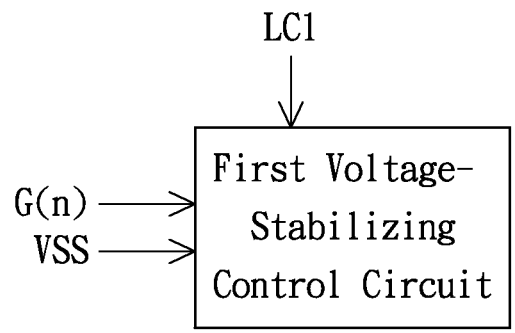
FIG. 9 is a schematic view of a first voltage-stabilizing control circuit in accordance with another exemplary embodiment of the present invention.

Refer to FIG. 9, which is a schematic view of a first voltage-stabilizing control circuit in accordance with another exemplary embodiment of the present invention. As shown in FIG. 9, the first voltage-stabilizing control circuit of the present exemplary embodiment is similar with the first voltage-stabilizing control circuit as shown in FIGS. 2 and 3, except that the present first voltage-stabilizing control circuit only receives the third control signal G(n) and does not receive the fourth control signal G(n−1). That is, the first voltage-stabilizing control circuit of the present exemplary embodiment does not comprise the transistor T55 and the transistor T56, such that the first voltage-stabilizing circuit 160 stop discharging the first node Q(n) and the output terminal of the second driving circuit 130 only when the present shift register SR(n) operates.

Figure 10:
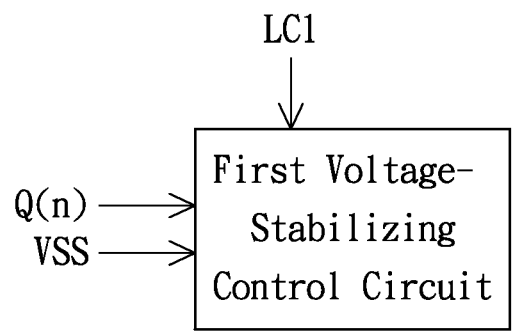
FIG. 10 is a schematic view of a first voltage-stabilizing control circuit in accordance with other exemplary embodiment of the present invention.

Refer to FIG. 10, which is a schematic view of a first voltage-stabilizing control circuit in accordance with other exemplary embodiment of the present invention. As shown in FIG. 10, the first voltage-stabilizing control circuit of the present exemplary embodiment is similar with the first voltage-stabilizing control circuit as shown in FIG. 9, except that the third control signal is not the corresponding gate driving-pulse signal G(n) outputted from the present-staged shift register SR(n), but the voltage on the first node Q(n). Thus it can ensure the first voltage-stabilizing circuit 160 stops discharging the first node Q(n) and the output terminal of the second driving circuit 130 when the present-staged shift register SR(n) operates.

Figure 11:
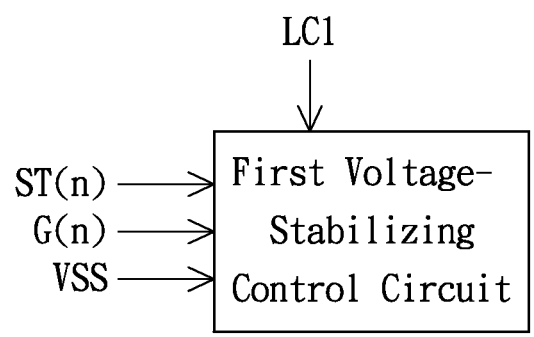
FIG. 11 is a schematic view of a first voltage-stabilizing control circuit in accordance with other exemplary embodiment of the present invention.

Refer to FIG. 11, which is a schematic view of a first voltage-stabilizing control circuit in accordance with other exemplary embodiment of the present invention. As shown in FIG. 11, the first voltage-stabilizing control circuit of the present exemplary embodiment is similar with the first voltage-stabilizing control circuit as shown in FIGS. 2 and 3, except that the fourth control signal received by the present first voltage-stabilizing control circuit is not the preceding gate driving-pulse signal G(n−1) outputted from the nearest preceding shift register SR(n−1), but the corresponding start-pulse signal ST(n) outputted from the present-staged shift register SR(n). Thus it can ensure the first voltage-stabilizing circuit 160 stops discharging the first node Q(n) and the output terminal of the second driving circuit 130 when the present-staged shift register SR(n) operates. Of course, the third control signal and the fourth control signal received by the first voltage-stabilizing control circuit may be altered in other manner.

In summary, since the second driving circuit of the shift register of the present invention employs the constant high reference voltage to charge the output terminal thereof, and the discharging circuit firstly discharges the first node to pull down the voltage on the first node before discharging the output terminal of the second driving circuit, and therefore can prevent the constant reference voltage from still charging the output terminal of the second driving circuit. Thus, it can greatly decrease the dynamic power consumption of the shift register.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register circuit comprising:
a plurality of shift registers, each of the shift registers being configured for outputting a corresponding start-pulse signal and a corresponding driving-pulse signal, and each of the shift registers comprising:
   a pull-up circuit receiving the corresponding start-pulse signal outputted from a nearest preceding shift register and a reference signal to charge a first node;
   a first driving circuit electrically coupled to the pull-up circuit at the first node and receive a corresponding clock signal, to generate the corresponding start-pulse signal according to a voltage on the first node;
   a second driving circuit electrically coupled to the pull-up circuit at the first node and receive a high reference voltage, to output the corresponding driving-pulse signal at an output terminal of the second driving circuit; and
   a discharging circuit comprising:
      a first transistor comprising a first control terminal, a first terminal and a second terminal, the first terminal being electrically coupled to the first node, the second terminal being electrically coupled to a low reference voltage and the first control terminal receiving a first control signal to discharge the first node during a first time period; and
      a second transistor comprising a second control terminal, a third terminal and a fourth terminal, the third terminal being electrically coupled to the output terminal of the second driving circuit, the fourth terminal being electrically coupled to the low reference voltage and the second control terminal receiving a second control signal to discharge the output terminal of the second driving circuit during a second time period;
   wherein a start point of the first time period is earlier than that of the second time period.

2. The shift register circuit according to claim 1, wherein the first control signal received by the first control terminal of the first transistor is the corresponding start-pulse signal outputted from a nearest succeeding shift register, to discharge the voltage on the first node during the first time period; and
the second control signal received by the second control terminal of the second transistor is the corresponding start-pulse signal outputted from a second nearest succeeding shift register, to discharge the output terminal of the second driving circuit during the second time period.

3. The shift register circuit according to claim 2, wherein the discharging circuit further comprises a third transistor comprising:
   a third control terminal;
   a fifth terminal electrically coupled to the second control terminal of the second transistor; and
   a sixth terminal electrically coupled to the low reference voltage;
   wherein the third control terminal receives the voltage on the first node to regulate the corresponding start-pulse signal received by the second control terminal of the second transistor.

4. The shift register circuit according to claim 1, wherein the first control signal received by the first control terminal of the first transistor is the corresponding driving-pulse signal outputted from a second nearest succeeding shift register, to discharge the first node during the first time period; and
the second control signal received by the second control terminal of the second transistor is the corresponding driving-pulse signal outputted from a third nearest succeeding shift register, to discharge the output terminal of the second driving circuit during the second time period.

5. The shift register circuit according to claim 1, wherein the first control signal received by the first control terminal of the first transistor is the corresponding driving-pulse signal outputted from a second nearest succeeding shift register, to discharge the first node during the first time period; and
the second control signal received by the second control terminal of the second transistor is the corresponding start-pulse signal outputted from the second nearest succeeding shift register, to discharge the output terminal of the second driving circuit.

6. The shift register circuit according to claim 1, wherein the pull-up circuit comprises a fourth transistor, and the fourth transistor comprises:
   a fourth control terminal receiving the corresponding start-pulse signal outputted from the nearest preceding shift register;
   a seventh terminal receiving the reference signal; and
   an eighth terminal electrically coupled to the first node.

7. The shift register circuit according to claim 6, wherein the reference signal is the high reference voltage.

8. The shift register circuit according to claim 6, wherein the reference signal is the corresponding driving-pulse signal outputted from the nearest preceding shift register.

9. The shift register circuit according to claim 6, wherein the reference signal is the corresponding start-pulse signal outputted from the nearest preceding shift register.

10. The shift register circuit according to claim 1, wherein the first driving circuit comprises:
a fifth transistor comprising:
a fifth control terminal electrically coupled to the first node;
a ninth terminal receiving the corresponding clock signal; and
a tenth terminal outputting the corresponding start-pulse signal; and
a capacitor electrically coupled between the first node and the tenth terminal.

11. The shift register circuit according to claim 1, wherein the second driving circuit comprises a sixth transistor comprising:
a sixth control terminal electrically coupled to the first node;
an eleventh terminal receiving the high reference voltage; and
a twelfth terminal outputting the corresponding driving-pulse signal.

12. The shift register circuit according to claim 1, wherein each of the shift registers further comprises:
a first voltage-stabilizing circuit electrically coupled to the first node and the output terminal of the second driving circuit; and
a first voltage-stabilizing control circuit electrically coupled to the first voltage-stabilizing circuit and receive at least one control signal to determine whether the first voltage-stabilizing circuit to discharge the first node and the output terminal of the second driving circuit.

13. The shift register circuit according to claim 12, wherein the first voltage-stabilizing circuit comprises:
a seventh transistor comprising:
a seventh control terminal electrically coupled to an output terminal of the first voltage-stabilizing control circuit;
a thirteenth terminal receiving the corresponding driving-pulse signal; and
a fourteenth terminal electrically coupled to the first node; and
an eighth transistor comprising:
an eighth control terminal electrically coupled to the output terminal of the first voltage-stabilizing control circuit;
a fifteenth terminal electrically coupled to the low reference voltage; and
a sixteenth terminal electrically coupled to the output terminal of the second driving circuit.

14. The shift register circuit according to claim 13, wherein the first voltage-stabilizing control circuit comprises:
a ninth transistor comprising:
a ninth control terminal electrically coupled to a reference voltage;
a seventeenth terminal electrically coupled to the reference voltage; and
an eighteenth terminal;
a tenth transistor comprising:
a tenth control terminal receiving a third control signal;
a nineteenth terminal electrically coupled to the eighteenth terminal and whereby an electrical connection node therebetween being used as a second node; and
a twentieth terminal electrically coupled to the low reference voltage;
an eleventh transistor comprising:
an eleventh control terminal electrically coupled to the second node;
a twenty-first terminal electrically coupled to the reference voltage; and
a twenty-second terminal; and
a twelfth transistor comprising:
a twelfth control terminal receiving the third control signal;
a twenty-third terminal electrically coupled to the low reference voltage; and
a twenty-fourth terminal electrically coupled to the twenty-second terminal and whereby an electrical connection node therebetween being used as the output terminal of the first voltage-stabilizing control circuit.

15. The shift register circuit according to claim 14, wherein the third control signal is the corresponding driving-pulse signal.

16. The shift register circuit according to claim 15, wherein the first voltage-stabilizing control circuit further comprises:
a thirteenth transistor comprising:
a thirteenth control terminal receiving a fourth control signal;
a twenty-fifth terminal electrically coupled to the second node; and
a twenty-sixth terminal electrically coupled to the low reference voltage; and
a fourteenth transistor comprising:
a fourteenth control terminal receiving the fourth control signal;
a twenty-seventh terminal electrically coupled to the low reference voltage; and
a twenty-eighth terminal electrically coupled to the output terminal of the first voltage-stabilizing control circuit.

17. The shift register circuit according to claim 16, wherein the fourth control signal is the corresponding driving-pulse signal outputted from the nearest preceding shift register.

18. The shift register circuit according to claim 16, wherein the fourth control signal is the corresponding start-pulse signal.

19. The shift register circuit according to claim 14, wherein the third control signal is the voltage on the first node.

* * * * *